(12) United States Patent
Ban et al.

(10) Patent No.: US 9,190,274 B2
(45) Date of Patent: Nov. 17, 2015

(54) METHODS OF FABRICATING FINE PATTERNS

(71) Applicant: SK HYNIX INC., Icheon (KR)

(72) Inventors: Keun Do Ban, Yongin (KR); Cheol Kyu Bok, Pohang (KR); Myoung Soo Kim, Seongnam (KR); Ki Lyoung Lee, Seoul (KR); Hyun Kyung Shim, Seoul (KR)

(73) Assignee: SK HYNIX INC., Icheon (KR)

( * ) Notice: Subject to any disclaimer, the term of this patent is extended or adjusted under 35 U.S.C. 154(b) by 35 days.

(21) Appl. No.: 14/135,145

(22) Filed: Dec. 19, 2013

(65) Prior Publication Data
US 2015/0031210 A1    Jan. 29, 2015

(30) Foreign Application Priority Data
Jul. 25, 2013  (KR) .......................... 10-2013-0088354

(51) Int. Cl.
*H01L 21/311*  (2006.01)
*H01L 21/033*  (2006.01)

(52) U.S. Cl.
CPC ........ *H01L 21/0338* (2013.01); *H01L 21/0337* (2013.01)

(58) Field of Classification Search
CPC .............. H01L 21/027; H01L 21/0271; H01L 21/0334; H01L 21/0337; H01L 21/0338
USPC ......... 438/586, 591, 671, 703, 717, 945, 950, 438/952
See application file for complete search history.

(56) References Cited

U.S. PATENT DOCUMENTS

2011/0300699 A1*  12/2011  Molas et al. ................. 438/586

FOREIGN PATENT DOCUMENTS

| KR | 10-2008-0068875 A | 7/2008 |
| KR | 10-2010-0079948 A | 7/2010 |

* cited by examiner

*Primary Examiner* — Kevin M Picardat

(57) ABSTRACT

Methods of forming fine patterns are provided. The method includes reinforcing a hydrophobic property of a hard mask layer using a surface treatment process to form a neutral layer, forming a block co-polymer layer on the neutral layer, and phase-separating the block co-polymer layer into first domains and second domains.

20 Claims, 20 Drawing Sheets

METHODS OF FABRICATING FINE PATTERNS

CROSS-REFERENCE TO RELATED APPLICATION

The present application claims priority under 35 U.S.C. 119(a) to Korean Application No. 10-2013-0088354, filed on Jul. 25, 2013, in the Korean Intellectual Property Office, which is herein incorporated by reference in its entirety.

BACKGROUND

1. Technical Field

Embodiments of the present disclosure relate to methods of fabricating a semiconductor device and, more particularly, to methods of fabricating fine patterns.

2. Related Art

In fabrication of electronic devices such as semiconductor devices, many efforts have been focused to integrate more patterns in a limited area of a semiconductor substrate. That is, attempts to increase the integration density of the electronic devices or the semiconductor devices have typically resulted in formation of fine patterns. Various techniques have been proposed to form the fine patterns such as small contact holes having a nano-scaled critical dimension (CD), for example, a size of about a few nanometers to about several tens of nanometers.

In the event that the fine patterns of the semiconductor devices are formed using only a photolithography process, there may be some limitations in forming the fine patterns due to image resolution limits of lithography apparatuses used in the photolithography process. Methods of forming the fine patterns using a self-assembly property of polymer molecules may be considered as a candidate for overcoming the image resolution limits of optical systems used in the photolithography process and for overcoming a limit to wavelengths of light sources of optical systems used in the photolithography process. However, the methods of forming the fine patterns using the self-assembly technique may be in development. Thus, there may be still some difficulties in employing the self-assembly technique at a production level to form the fine patterns of highly integrated semiconductor devices.

SUMMARY

Various embodiments are directed to methods of fabricating fine patterns.

According to some embodiments, a method of fabricating fine patterns includes reinforcing a hydrophobic property of a hard mask layer using a surface treatment process to form a neutral layer, forming a block co-polymer (BCP) layer on the neutral layer, and phase-separating the block co-polymer layer into first domains and second domains.

According to further embodiments, a method of fabricating fine patterns includes forming guide patterns on a hard mask layer, applying a surface treatment process to portions of the hard mask layer exposed by the guide patterns to form neutral portions whose hydrophobic property is reinforced, forming a block co-polymer layer on the hard mask layer including the neutral portions, and phase-separating the block co-polymer layer into first domains and second domains.

According to further embodiments, a method of fabricating fine patterns includes forming mask patterns on a hard mask layer, selectively removing portions of the hard mask layer exposed by the mask patterns to form hard mask patterns, applying a surface treatment process to the hard mask patterns to form neutral patterns whose hydrophobic property is reinforced, forming a block co-polymer layer on the neutral patterns, and phase-separating the block co-polymer layer into first domains and second domains.

According to further embodiments, a method of forming fine patterns includes providing a hard mask layer over an underlying layer, performing a surface treatment process to a partial region of hard mask layer to form a neutral layer and a non-neutral layer, wherein the neutral layer has a hydrophobic property different from the non-neutral layer, providing a copolymer layer over the hard mask layer, wherein the copolymer layer includes first and second polymer blocks, and performing a phase-separation process to the copolymer layer to align the first polymer block over the non-neutral layer to form a first domain and to alternatively align the first and the second polymer blocks over the neutral layer to form a second domain.

The method further includes selectively removing one of the first and the second domains to form a copolymer pattern; and patterning the underlying layer using the copolymer pattern.

BRIEF DESCRIPTION OF THE DRAWINGS

Embodiments will become more apparent in view of the attached drawings and accompanying detailed description, in which.

DETAILED DESCRIPTION OF THE EMBODIMENTS

Figure 1:
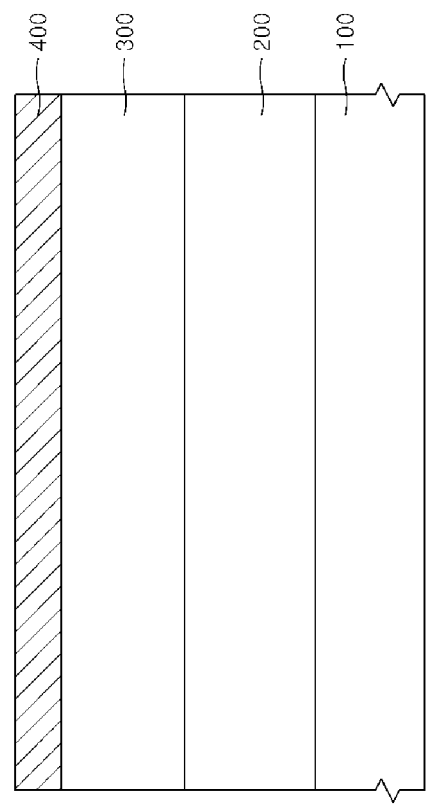
FIGS. 1 to 10 are cross-sectional views illustrating a method of fabricating fine patterns according to an embodiment.

Various embodiments may provide methods of fabricating fine patterns of semiconductor devices by self-assembling domains of a block co-polymer (BCP) material. Phase-separated domains of the BCP material may be spontaneously self-assembled to produce fine structures that the domains are repeatedly arrayed. In the event that fine patterns are formed using a self-assembly of the domains of the BCP material, the fine patterns may be realized to have a similar size to a thickness of a single molecular layer. As a result, the resolution limits of the photolithography process may be overcome by the self-assembly of the domains of the BCP material.

According to the embodiments, a lower layer coated with a BCP layer may be formed to include a hydrophilic material layer, for example, at least one of a silicon oxynitride layer (SiON) layer and a silicon oxide ($SiO_2$) layer. The lower layer may be treated by an ion implantation process to have a hydrophobic property. As a result, polymer blocks of the BCP layer may be vertically aligned on the lower layer. Surfaces of the silicon oxynitride layer (SiON) layer and the silicon oxide ($SiO_2$) layer may originally have a hydrophilic property. Thus, it may be difficult to directly use the silicon oxynitride layer (SiON) layer and the silicon oxide ($SiO_2$) layer as a neutral layer inducing the vertical alignment of the polymer blocks in the BCP layer. The neutral layer may not exhibit a relatively high affinity to any one of the polymer blocks constituting the BCP layer. For example, the neutral layer may be a layer exhibiting an intermediate level of affinity to all the polymer blocks of the BCP layer such that one of the polymer blocks is not primarily assembled.

The polymer blocks of the BCP layer may have substantially the same affinity on the neutral layer. Thus, the polymer blocks may be separately and alternately aligned with each other on the neutral layer.

In the methods of fabricating fine patterns using the self-assembly technique of the BCP layer known as a direct self-assembly (DSA) lithography technique, an organic material layer is used as the neutral layer leading the vertical alignment of the polymer blocks of the BCP layer. However, in such a case, the BCP layer may also correspond to one of the organic material layers and thus exhibit a poor etch selectivity with respect to the neutral layer. That is, it may be difficult to obtain a high etch selectivity between the BCP layer and the neutral layer (i.e., an organic material layer). According to the embodiments, the neutral layer may be formed of an inorganic material layer different from the BCP layer and may be treated by an ion implantation process to have a hydrophobic surface. As a result, the polymer blocks of the BCP layer may be vertically aligned on the neutral layer, and the neutral layer may have a high etch selectivity with respect to the BCP layer, because the neutral layer is formed of an inorganic material layer such as a silicon oxynitride (SiON) layer, a silicon oxide ($SiO_2$) layer and a combination thereof. Further, the silicon oxynitride (SiON) layer or the silicon oxide ($SiO_2$) layer may act as a hard mask layer, thus simplifying the fabrication process without a need of forming any additional mask layer.

The methods of fabricating fine patterns according to the embodiments may be used in formation of contact holes or line patterns constituting memory devices or logic devices. The memory devices may include dynamic random access memory (DRAM) devices, static random access memory (SRAM) devices, flash memory devices, magnetic random access memory (MRAM) devices, phase changeable random access memory (PcRAM) devices, resistive random access memory (ReRAM) devices and ferroelectric random access memory (FeRAM) devices.

It will be understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to be restrictive.

FIG. 1 illustrates a step of forming a hard mask layer 400. Specifically, an etch target layer 200, a main hard mask layer 300 and the hard mask layer 400 may be sequentially formed on a semiconductor substrate 100. The semiconductor substrate 100 may include transistors (not shown) constituting memory cells of a memory device such as a DRAM device. The etch target layer 200 may be patterned by a subsequent etching process that employs the hard mask layer 400 and/or the main hard mask layer 300 as an etch mask. The etch target layer 200 may be formed of an insulation layer such as a silicon oxide layer acting as an interlayer insulation layer or may be formed of a conductive layer such as a metal layer which is patterned to form interconnection lines in a subsequent process.

The hard mask layer 400 and the main hard mask layer 300 may act as an etch mask when the etch target layer 200 is etched in a subsequent process. The main hard mask layer 300 may be formed to include an amorphous carbon layer or a spin-on-carbon (SOC) layer. The hard mask layer 400 may be formed to provide an etch mask layer which is used when the main hard mask layer 300 acting as a substantial etch mask layer is etched.

In the event that the main hard mask layer 300 is formed to include an amorphous carbon layer or a spin-on-carbon (SOC) layer having a thickness of about 1500 angstroms, the hard mask layer 400 may be formed to include an inorganic material layer protecting the main hard mask layer 300. The hard mask layer 400 may be formed to include an inorganic material layer having a hydrophilic property, for example, a dielectric layer containing a silicon material. In some embodiments, the hard mask layer 400 may include at least one of a silicon oxide ($SiO_2$) layer and a silicon oxynitride (SiON) layer. In a particular embodiment, the hard mask layer 400 may include a silicon oxynitride (SiON) layer exhibiting a high etch selectivity with respect to a block co-polymer layer which is formed in a subsequent process. In such a case, the silicon oxynitride (SiON) layer used as the hard mask layer 400 may have a thickness of about 200 angstroms.

Figure 2:
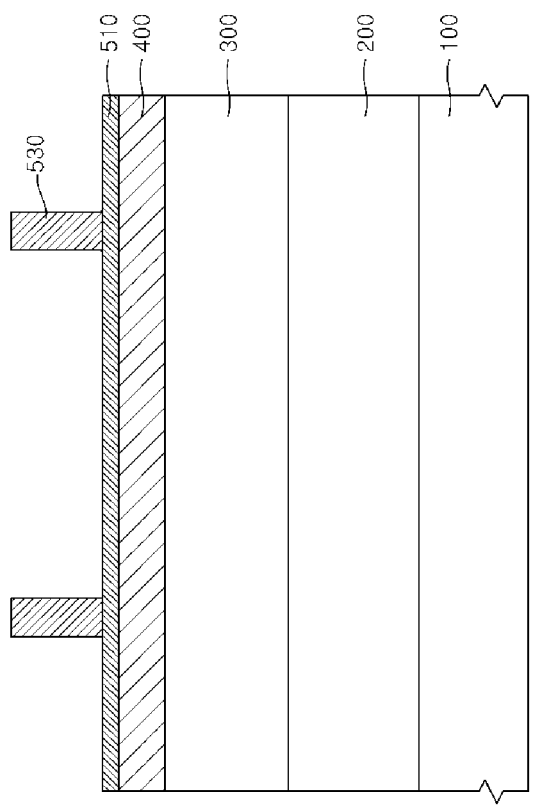

FIG. 2 illustrates a step of forming photoresist patterns 530. Specifically, a bottom anti-reflective coating (BARC) layer 510 may be formed on the hard mask layer 400. A photoresist layer may be formed on the BARC layer 510 and may be exposed and developed to form the photoresist patterns 530.

Figure 3:
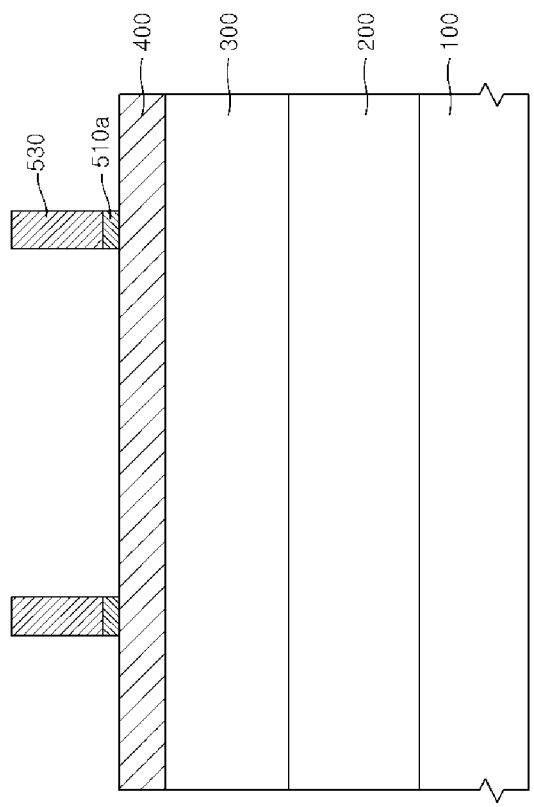

FIG. 3 illustrates a step of forming guide patterns 510a+ 530. Specifically, a BARC trim etching process may be performed to selectively remove portions of the BARC layer 510, which are exposed by the photoresist patterns 530. As a result of the BARC trim etching process, BARC patterns 510a may be formed. The BARC patterns 510a and the photoresist patterns 530 may comprise the guide patterns 510a+530 on the hard mask layer 400. The guide patterns 510a+530 may be formed such that a space between the guide patterns 510a+ 530 is "N+1" (wherein, "N" denotes a positive integer) times greater than a width of each of the guide patterns 510a+530. The guide patterns 510a+530 may be formed to control sizes and the number of domains of a block co-polymer (BCP) layer, which is formed in a subsequent process, when polymer blocks of the BCP layer are phase-separated to form the domains.

Figure 4:
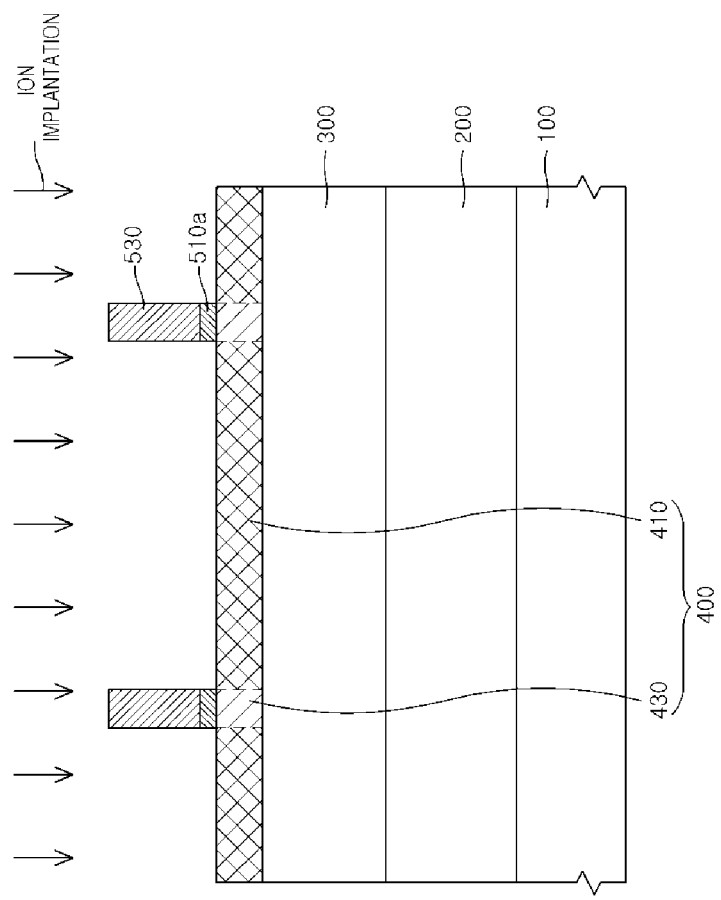

FIG. 4 illustrates a step of forming neutral portions 410 in the hard mask layer 400. Specifically, a surface treatment process may be selectively applied to portions of the hard mask layer 400, which are exposed by the guide patterns 510a+530. The surface treatment process may be performed to reinforce a hydrophobic property of surfaces of the exposed portions of the hard mask layer 400 by introducing charged particles, for example, impurity ions into the exposed portions of the hard mask layer 400. That is, if the charged particles are implanted into the hard mask layer 400 using the guide patterns 510a+530 as ion implantation masks, the implanted regions of the hard mask layer 400 may be changed to have a hydrophobic property even though the hard mask layer 400 has been formed to have a hydrophilic property.

The charged particles may be implanted into the exposed portions of the hard mask layer 400 using an ion implantation process that employs a gas, for example, including a carbon fluoride gas as a source gas. The carbon fluoride gas may be, for example, a carbon tetrafluoride ($CF_4$) gas. The surface treatment on a layer may increase a contact angle of waterdrop on the layer to change surface property. A contact angle of waterdrop on a silicon layer may be detected as about 28 degrees to about 36 degrees before the surface treatment process. However, the contact angles of the waterdrops with respect to the silicon layers may increase to 97.3 degrees, 105.2 degrees or 106.8 degrees according to an implantation energy of the ion implantation process that employs the carbon tetrafluoride ($CF_4$) gas as a source gas. That is, the surface treatment process, for example, the ion implantation process may change a hydrophilic surface of the hard mask layer 400 into a hydrophobic surface thereof.

If the ion implantation process is applied to the exposed regions of the hard mask layer 400, the exposed regions of the hard mask layer 400 may be changed into the neutral portions 410 having hydrophobic surfaces. Because the neutral portions 410 have hydrophobic surfaces, the polymer blocks of the BCP layer, which is formed on the neutral portions 410 in a subsequent process, may be vertically aligned when the BCP layer is phase-separated. The neutral portions 410 may be formed of an organic material layer. However, according to the embodiments, the neutral portions 410 may have a surface affinity close to a hydrophobic property by directly implanting impurity ions into an inorganic material layer such as a silicon oxynitride (SiON) layer employed as the hard mask layer 400 to change a surface energy of the inorganic material layer. Accordingly, an extra process for forming an organic material layer may be omitted.

A hydrophobic property of the hard mask layer 400 may depend on a surface energy of the hard mask layer 400, and the surface energy of the hard mask layer 400 may be controlled according to at least one among a source gas, a dose of impurity ions, a radio frequency (RF) power, a bias power, and a process pressure of the ion implantation process employed as the surface treatment process. Further, the source gas may be excited to form plasma, and excited ions, for example, charged particles in the plasma may be implanted into the hard mask layer 400 to treat a surface of the hard mask layer 400. The ion implantation process may be performed using ion beams or the plasma.

The exposed portions of the hard mask layer 400 may be surface-treated by the ion implantation process to form the neutral portions 410, and unexposed portions of the hard mask layer 400 under the guide patterns 510a+530 may remain without application of the surface treatment to form untreated portions 430 having hydrophilic surfaces. These untreated portions 430 may be defined by the guide patterns 510a+530. That is, a pattern shape and a width of the untreated portions 430 may be determined by a pattern shape and a width of the guide patterns 510a+530.

Figure 5:
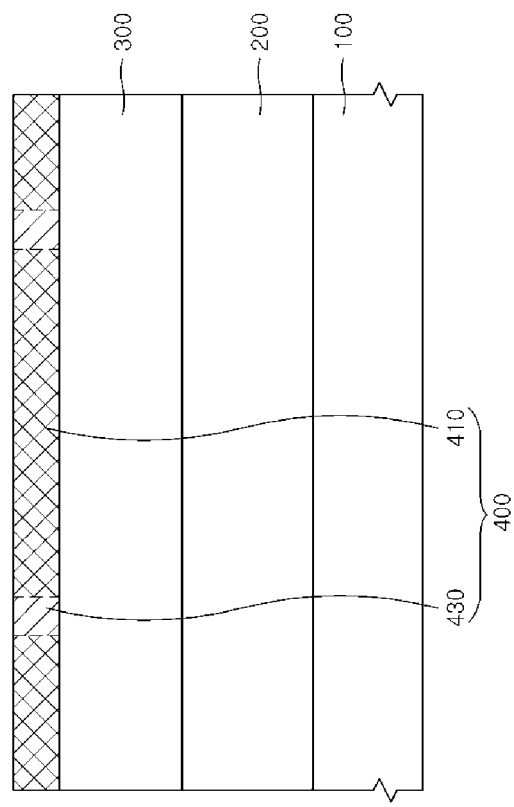

FIG. 5 illustrates a step of removing the guide patterns 510a+530. Specifically, the guide patterns 510a+530 may be selectively removed. In some embodiments, the guide patterns 510a+530 may be selectively removed using a wet etchant to expose the untreated portions 430 of the hard mask layer 400.

Figure 6:
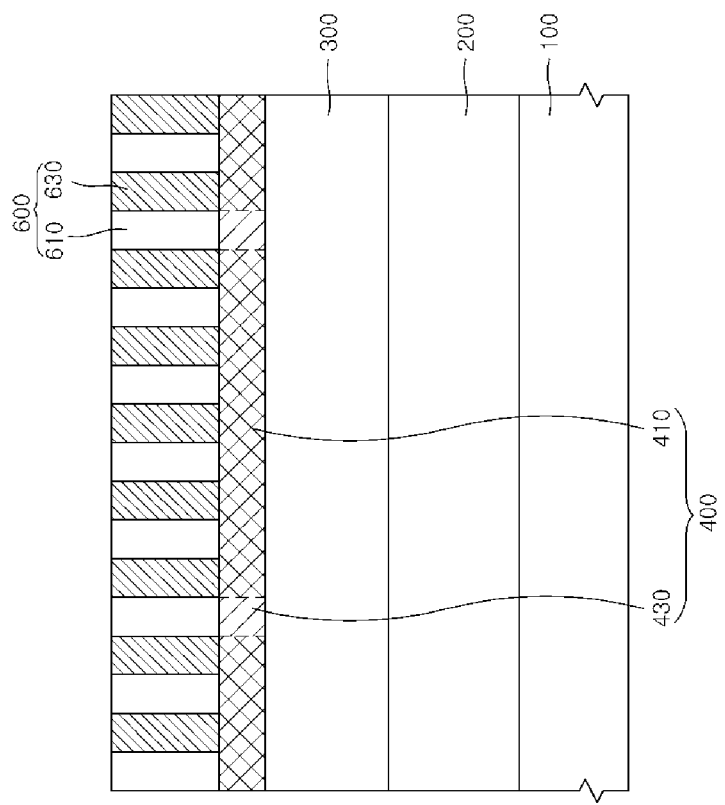

FIG. 6 illustrates a step of forming a phase-separated block co-polymer (BCP) layer 600 covering the hard mask layer 400. Specifically, after a BCP layer 600 is formed on the hard mask layer 400, the BCP layer 600 may be annealed to phase-separate the BCP layer 600 into first domains 610 and second domains 630. The BCP layer 600 may be formed by coating a polystyrene-poly(methyl meta acrylate) (PS-PMMA) co-polymer material. Polystyrene (PS) blocks in the BCP layer 600 may be phase-separated to form the first domains 610, and poly(methyl meta acrylate) (PMMA) blocks in the BCP layer 600 may be phase-separated to form the second domains 630.

The BCP layer may be a functional polymer material that polymer blocks having two or more distinct structures are combined with each other by a covalent bond to constitute a single polymer. The polymer blocks having distinct structures may have different mixed properties and different solubilities from each other. These differences may provide a possibility that block polymers of the BCP layer are phase-separated or selectively dissolved in a liquid state or in a solid state to form a self-assembled structure.

Forming a nano structure in a specific shape through a self-assembly of the BCP layer may occur under the influence of a physical property and/or a chemical property of the polymer blocks of the BCP layer. When a BCP layer comprising of two distinct polymer blocks is self-assembled on a substrate, the self-assembled structure of the BCP layer may be formed to have a three dimensional cubic shape, a three dimensional double helix shape, a two dimensional hexagonal packed column shape, a two dimensional lamella shape, or another shape according to factors such as a volume ratio, an annealing temperature for phase separation, and a molecule size of the polymer blocks comprising the BCP layer. A size of each polymer block in the various self-assembled structures may be proportional to a molecular weight of the corresponding polymer block.

The BCP layer may include polybutadiene-polybutylmethacrylate co-polymer, polybutadiene-polydimethylsiloxane co-polymer, polybutadiene-polymethylmethacrylate co-polymer, polybutadienepolyvinylpyridine co-polymer, polybutylacrylate-polymethylmethacrylate co-polymer, polybutylacrylate-polyvinylpyridine co-polymer, polyisoprene-polyvinylpyridine co-polymer, polyisoprene-polymethylmethacrylate co-polymer, polyhexylacrylatepolyvinylpyridine co-polymer, polyisobutylene-polybutylmethacrylate co-polymer, polyisobutylene-polymethylmethacrylate co-polymer, polyisobutylene-polybutylmethacrylate co-polymer, polyisobutylenepolydimethylsiloxane co-polymer, polybutylmethacrylatepolybutylacrylate co-polymer, polyethylethylene-polymethylmethacrylate co-polymer, polystyrene-polybutylmethacrylate co-polymer, polystyrene-polybutadiene co-polymer, polystyrene-polyisoprene co-polymer, polystyrene-polydimethylsiloxane co-polymer, polystyrene-polyvinylpyridine co-polymer, polyethylethylene-polyvinylpyridine co-polymer, polyethylene-polyvinylpyridine co-polymer, polyvinylpyridinepolymethylmethacrylate co-polymer, polyethyleneoxide-polyisoprene co-polymer, polyethyleneoxide-polybutadiene co-polymer, polyethyleneoxide-polystyrene co-polymer, polyethyleneoxidepolymethylmethacrylate co-polymer, polyethyleneoxide-polydimethylsiloxane co-polymer, polystyrene-polyethyleneoxide co-polymer, or a combination thereof. Alternatively, the BCP layer may be a tri-block co-polymer material having three distinct polymer blocks.

In order to rearrange and align the polymer blocks of the BCP layer 600 through a phase separation of the BCP layer 600, the BCP layer 600 may be annealed at a temperature exceeding the glass transition temperature Tg of the BCP layer 600. For example, the BCP layer 600 may be annealed at a temperature of about 100 degrees Celsius to about 190 degrees Celsius for about one hour to about twenty four hours to rearrange and align the polymer blocks of the BCP layer 600.

On the neutral portions 410 of the hard mask layer 400, the polymer blocks of the BCP layer 600 may be vertically aligned. Since the untreated portions 430 of the hard mask layer 400 have hydrophilic surfaces, any one of the polymer blocks in the BCP layer 600 may be primarily aligned on the untreated portion 430. For example, the first domains 610 of the BCP layer 600 may be primarily aligned on the respective untreated portions 430. On the neutral portions 410 between the untreated portions 430, both of the polymer blocks of the BCP layer 600 may have substantially the same affinity. Thus, the BCP layer 600 may be phase-separated such that the polymer blocks are vertically aligned on the neutral portions 410. As described above, since the first domains 610 of the BCP layer 600 are primarily aligned on the untreated portions 430, the first domains 610 and the second domains 630 of the BCP layer 600 may be alternately and repeatedly aligned on the neutral portions 410 in a lateral direction.

If each of the guide patterns (e.g., 510*a*+530 of FIG. 4) is formed in an elongated line shape in a plan view, each of the untreated portions 430 may be in a line shape and each of the first domains 610 primarily aligned on the untreated portions 430 may also have a line shape. Further, the first domains 610 and the second domains 630 of the BCP layer 600 may be alternately and repeatedly aligned along a lateral direction on the neutral portion 410 between two adjacent untreated portions 430. Thus, the first domains 610 and the second domains 630 of the BCP layer 600 may be phase-separated to have a lamella shape.

Figure 7:
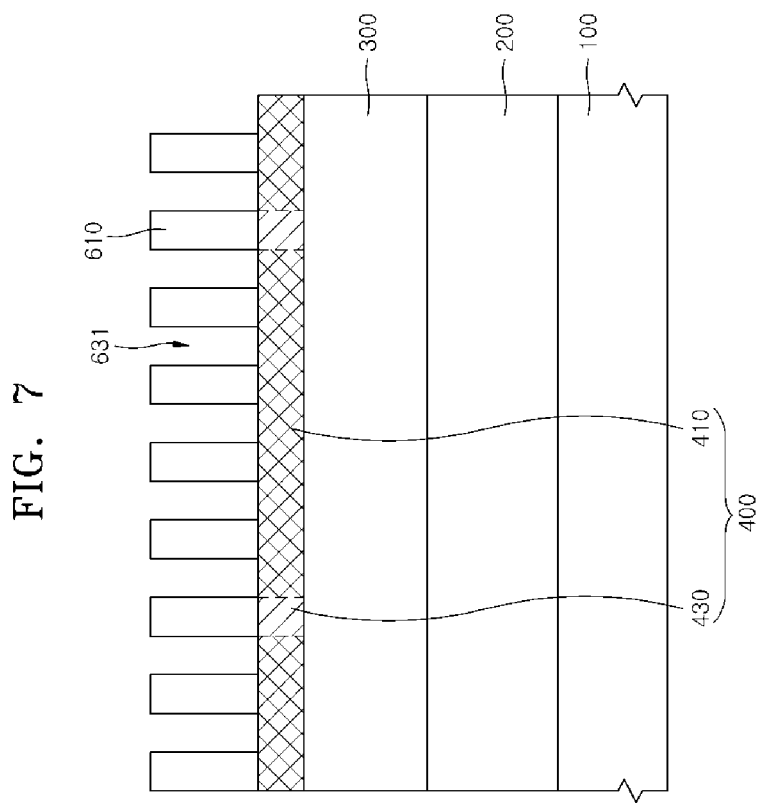

FIG. 7 illustrates a step of selectively removing the second domains 630. Specifically, the second domains 630 may be selectively removed to form opening portions 631. PMMA blocks comprising the second domains 630 may be selectively etched and removed. Since the solubility of the PMMA blocks is different from that of PS blocks constituting the first domains 610, the PMMA blocks constituting the second domains 630 may be selectively removed using a wet etching process that employs a solution as an etchant. If each of the second domains 630 is in a line shape, each of the opening portions 631 may also have an elongated line shape.

Figure 8:
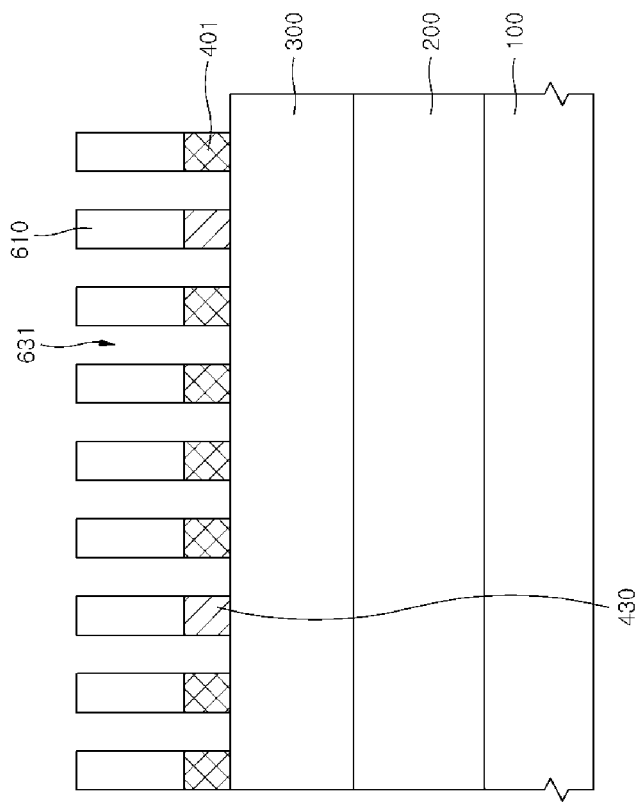

FIG. 8 illustrates a step of forming hard mask patterns 401. Specifically, after the second domains 630 are selectively removed, the hard mask layer 400 may be etched using the first domains 610 as etch masks to form the hard mask patterns 401. Because the hard mask layer 400 is formed of an inorganic material layer such as a silicon oxynitride (SiON) layer and the first domains 610 are formed of an organic material layer such as the Polystyrene (PS) blocks, the first domains 610 may have a high etch selectivity with respect to the hard mask layer 400. Thus, the hard mask patterns 401 may be formed to have pattern shapes that the first domains 610 are accurately transferred.

Figure 9:
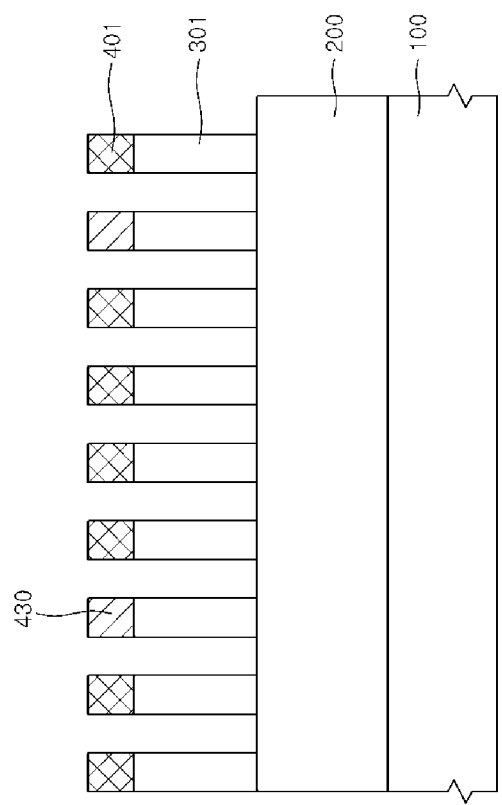

FIG. 9 illustrates a step of forming main hard mask patterns 301. Specifically, the main hard mask layer 300 may be etched using the hard mask patterns 401 as etch masks to form the main hard mask patterns 301. As a result, the main hard mask patterns 301 may be formed to have pattern shapes that the hard mask patterns 401 are accurately transferred.

Figure 10:
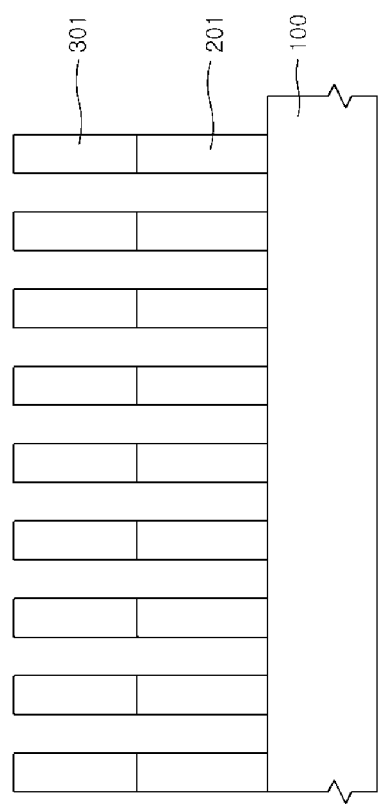

FIG. 10 illustrates a step of forming etch target patterns 201. Specifically, the etch target layer 200 may be etched using the main hard mask patterns 301 as etch masks to form the etch target patterns 201. In the event that etch target layer 200 is formed of a conductive layer, the etch target patterns 201 may be conductive line patterns which are repeatedly arrayed. For example, the etch target patterns 201 may be used as conductive interconnection lines of memory devices or logic devices. The memory devices may include DRAM devices, SRAM devices, flash memory devices, MRAM devices, ReRAM devices, FeRAM devices and PcRAM devices. As such, the embodiments described above may be applied to formation of fine patterns of semiconductor devices.

Figure 11:
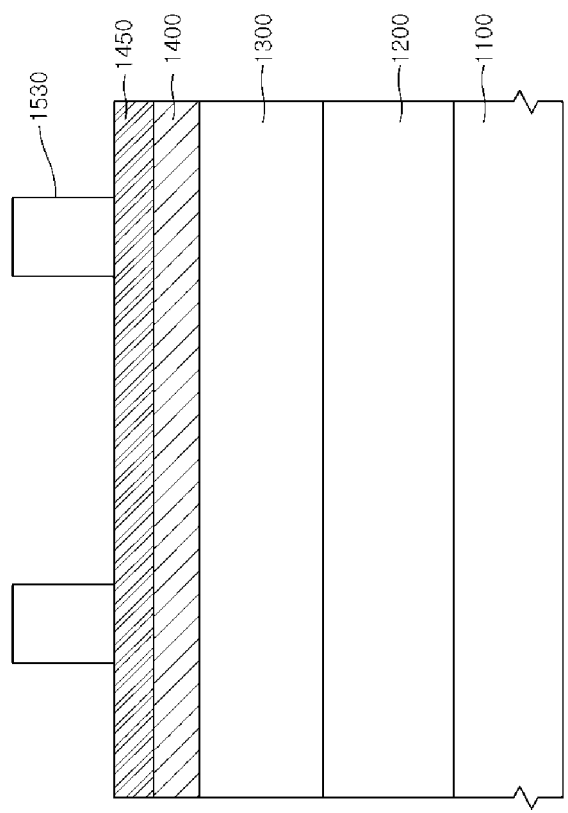
FIGS. 11 to 15 are cross-sectional views illustrating a method of fabricating fine patterns according to another embodiment.

FIG. 11 illustrates a step of forming a polymer matrix layer 1450. Specifically, an etch target layer 1200, a main hard mask layer 1300, and a hard mask layer 1400 may be sequentially formed on a semiconductor substrate 1100. The main hard mask layer 1300 may be formed to include an amorphous carbon layer or a spin-on-carbon (SOC) layer. In the event that the main hard mask layer 1300 includes an amorphous carbon layer or a spin-on-carbon (SOC) layer and has a thickness of about 1500 angstroms, the hard mask layer 1400 may include an inorganic material layer protecting the main hard mask layer 1300. For example, the hard mask layer 1400 may include a silicon oxide ($SiO_2$) layer or a silicon oxynitride (SiON) layer.

The polymer matrix layer 1450 may be coated on the hard mask layer 1400. The polymer matrix layer 1450 may be formed by coating a polymer material. In some embodiments, the polymer matrix layer 1450 may be formed by coating any one of polymers comprising a block co-polymer (BCP) layer to be formed in a subsequent process, for example, one of a polystyrene (PS) polymer material and a poly(methyl meta acrylate) (PMMA) polymer material.

Photoresist patterns 1530 may be formed on the polymer matrix layer 1450. In such a case, it may be unnecessary to form a bottom anti-reflective coating (BARC) layer prior to formation of the photoresist patterns 1530 because of the presence of the polymer matrix layer 1450. The photoresist patterns 1530 may be formed by coating a photoresist layer on the polymer matrix layer 1450 and exposing and developing the photoresist layer.

Figure 12:
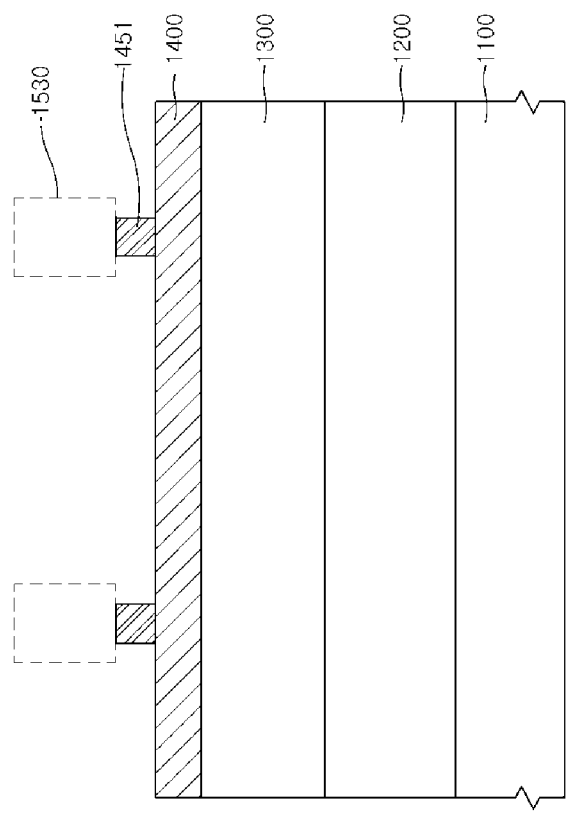

FIG. 12 illustrates a step of forming guide patterns 1451. Specifically, the polymer matrix layer 1450 may be etched using the photoresist patterns 1530 as etch masks to form polymer matrix patterns, that is, the guide patterns 1451. The guide patterns 1451 may be formed such that a space between the guide patterns 1451 is "N+1" (wherein, "N" denotes a positive integer) times greater than a width of each of the guide patterns 1451. The guide patterns 1451 may be formed to control sizes and the number of domains of a block co-polymer (BCP) layer, which is formed in a subsequent process, when polymer blocks of the BCP layer are phase-separated to form the domains.

Figure 13:
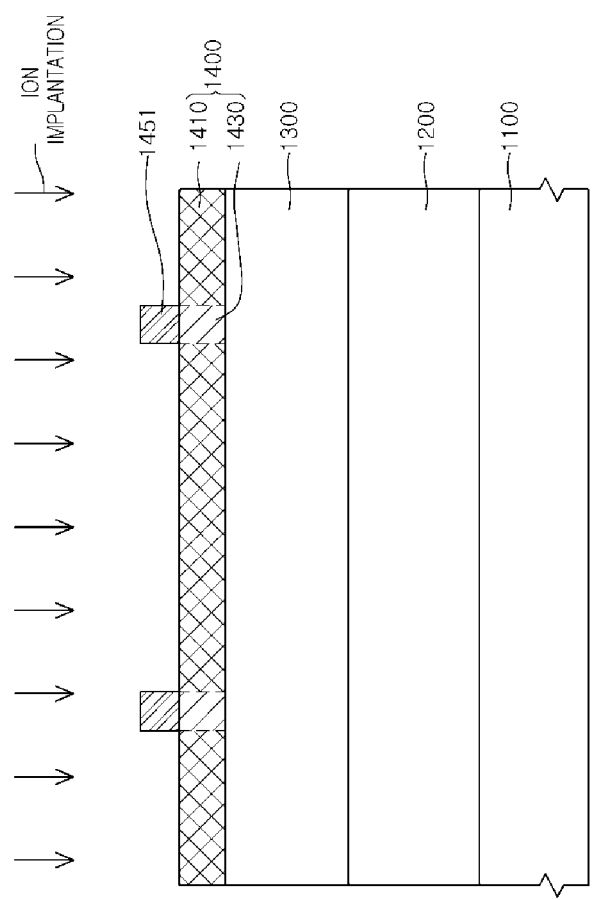

FIG. 13 illustrates a step of forming neutral portions 1410 in the hard mask layer 1400. Specifically, a surface treatment process may be selectively applied to portions of the hard mask layer 1400, which are exposed by the guide patterns 1451. The surface treatment process may be performed to reinforce a hydrophobic property of surfaces of the exposed portions of the hard mask layer 1400 by introducing charged particles, for example, impurity ions into the exposed portions of the hard mask layer 1400. That is, if the charged particles are implanted into the hard mask layer 1400 using the guide patterns 1451 as ion implantation masks, the implanted regions of the hard mask layer 1400 may be changed to have a hydrophobic property even though the hard mask layer 1400 has initially a hydrophilic property.

If the ion implantation process is applied to the exposed regions of the hard mask layer 1400, the exposed regions of the hard mask layer 1400 may be changed into the neutral portions 1410 having hydrophobic surfaces. Meanwhile, unexposed portions of the hard mask layer 1400 under the guide patterns 1451 may remain hydrophilic because the surface treatment is not applied to the untreated portions 1430.

Figure 14:
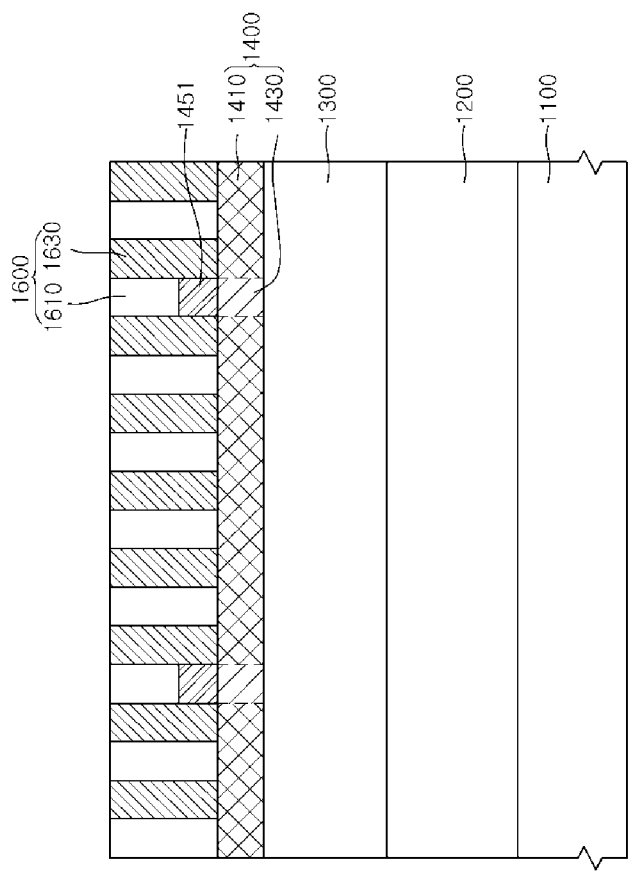

FIG. 14 illustrates a step of forming a phase-separated block co-polymer (BCP) layer 1600 covering the hard mask layer 1400. Specifically, after forming a BCP layer 1600 on the hard mask layer 1400, the BCP layer 1600 may be annealed to phase-separate the BCP layer 1600 into first domains 1610 and second domains 1630. The BCP layer 1600 may be formed by coating a polystyrene-poly(methyl meta acrylate) (PS-PMMA) co-polymer material. Polystyrene (PS) blocks in the BCP layer 1600 may be phase-separated to form the first domains 1610, and poly(methyl meta acrylate) (PMMA) blocks in the BCP layer 1600 may be phase-separated to form the second domains 1630.

Polymer blocks of the BCP layer 1600 may be vertically aligned on the neutral portions 1410 of the hard mask layer 1400 because the neutral portions 1410 have hydrophobic surfaces, as described previously. The guide patterns 1451 remaining on the hard mask layer 1400 may be formed to include PS polymers, as described above. In such a case, the first domains 1610 consisting of the PS polymers in the BCP layer 1600 may be primarily aligned on respective ones of the guide patterns 1451. Meanwhile, since the neutral portions 1410 between the untreated portions 1430 have hydrophobic surfaces, the BCP layer 1600 may be phase-separated such that the polymer blocks are vertically aligned on the neutral portions 1410. As described above, since the first domains 1610 of the BCP layer 1600 are primarily arrayed and aligned on respective ones of the guide patterns 1451, the first domains 1610 and the second domains 1630 of the BCP layer 1600 may be alternately and repeatedly aligned on each of the neutral portions 1410 in a lateral direction.

If each of the guide patterns 1451 is formed to have an elongated line shape in a plan view, each of the first domains 1610 primarily aligned on each guide pattern 1451 may also be formed to have a line shape. In such a case, the first domains 1610 and the second domains 1630 of the BCP layer 1600 may be alternately and repeatedly aligned along a lateral direction on the neutral portion 1410 between two adjacent untreated portions 1430.

Figure 15:
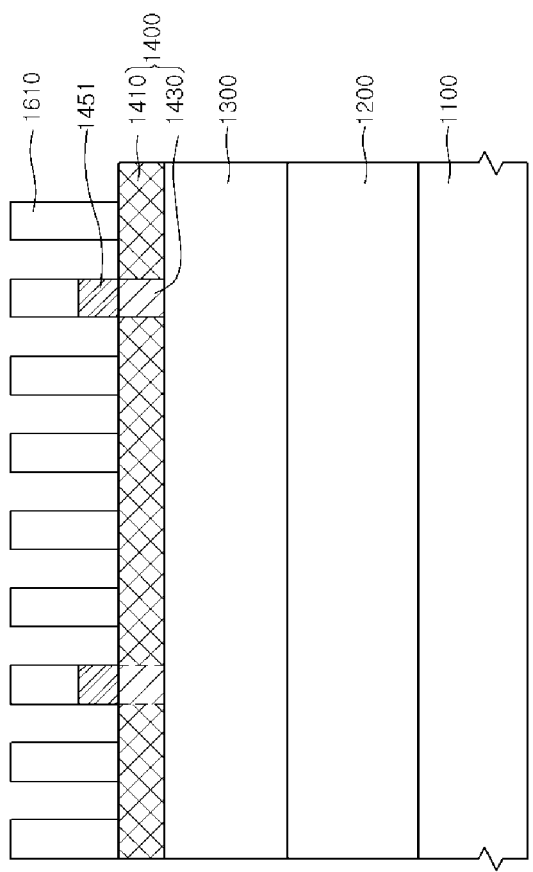

FIG. 15 illustrates a step of selectively removing the second domains 1630. Specifically, the second domains 1630 may be selectively removed to form opening portions between the first domains 1610. That is, PMMA blocks comprising the second domains 1630 may be selectively etched and removed. Since the solubility of the PMMA blocks is different from that of the PS blocks constituting the first domains 1610, the PMMA blocks comprising the second domains 1630 may be selectively removed using a wet etching process that employs a solution as an etchant. If each of the second domains 1630 is formed to have a line shape, each of the opening portions may also be formed to have an elongated line shape.

Although not shown in the drawings, after selectively removing the second domains 1630, the hard mask layer 1400 may be etched using the first domains 610 as etch masks to form hard mask patterns. Further, the main hard mask layer 1300 may be etched using the hard mask patterns as etch masks to form main hard mask patterns, and the etch target layer 1200 may be etched using the main hard mask patterns as etch masks to form etch target patterns.

Figure 16:
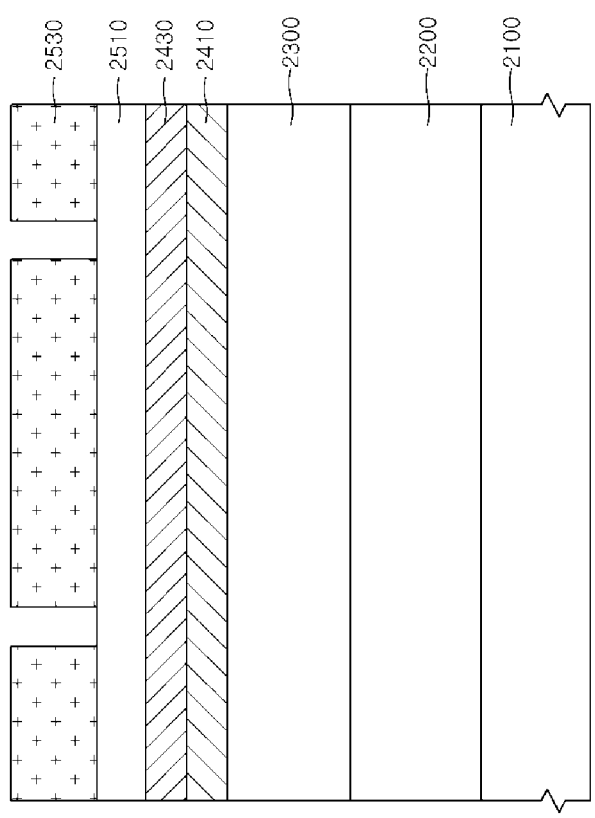
FIGS. 16 to 20 are cross-sectional views illustrating a method of fabricating fine patterns according to still another embodiment.

FIG. 16 illustrates a step of forming photoresist patterns 2530. Specifically, an etch target layer 2200, a main hard mask layer 2300, a lower layer 2410, and a hard mask layer 2430 may be sequentially formed on a semiconductor substrate 2100. The main hard mask layer 2300 may be formed to include an amorphous carbon layer or a spin-on-carbon (SOC) layer. In the event that the main hard mask layer 2300 includes an amorphous carbon layer or a spin-on-carbon (SOC) layer to a thickness of about 1500 angstroms, the lower layer 2410 may include an inorganic material layer protecting the main hard mask layer 2300. The hard mask layer 2430 may be formed to include a silicon oxide ($SiO_2$) layer or a silicon oxynitride (SiON) layer. The lower layer 2410 and the hard mask layer 2430, in combination, may serve as a combined hard mask layer. The lower layer 2410 and the hard mask layer 2430 may be formed of inorganic material layers having different surface energies from each other. For example, the lower layer 2410 may be formed to include a silicon oxide ($SiO_2$) layer, and the hard mask layer 2430 may be formed to include a silicon oxynitride (SiON) layer.

A bottom anti-reflective coating (BARC) layer 2510 may be formed on the hard mask layer 2430. A photoresist layer may be formed on the BARC layer 2510 and the photoresist layer may be exposed and developed to form photoresist patterns 2530.

Figure 17:
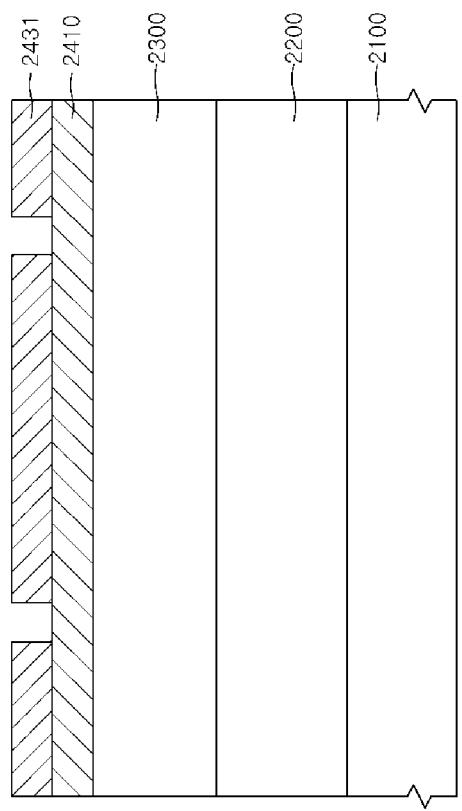

FIG. 17 illustrates a step of forming hard mask patterns 2431. Specifically, a BARC trim etching process may be performed to selectively remove portions of the BARC layer 2510, which are exposed by the photoresist patterns 2530. As a result of the BARC trim etching process, BARC patterns may be formed and portions of the hard mask layer 2430 may be exposed. Subsequently, the exposed portions of the hard mask layer 2430 may be selectively etched to form the hard mask patterns 2431. Accordingly, the hard mask patterns 2431 may be formed to have substantially the same shapes as the photoresist patterns 2530. The hard mask patterns 2431 may be formed such that a width of the hard mask patterns 2431 is "N+1" (wherein, "N" denotes a positive integer) times greater than a space between the hard mask patterns 2431. The hard mask patterns 2431 may be formed to control sizes and the number of domains of a block co-polymer (BCP) layer, which is formed in a subsequent process, when polymer blocks of the BCP layer are phase-separated to form the domains.

Figure 18:
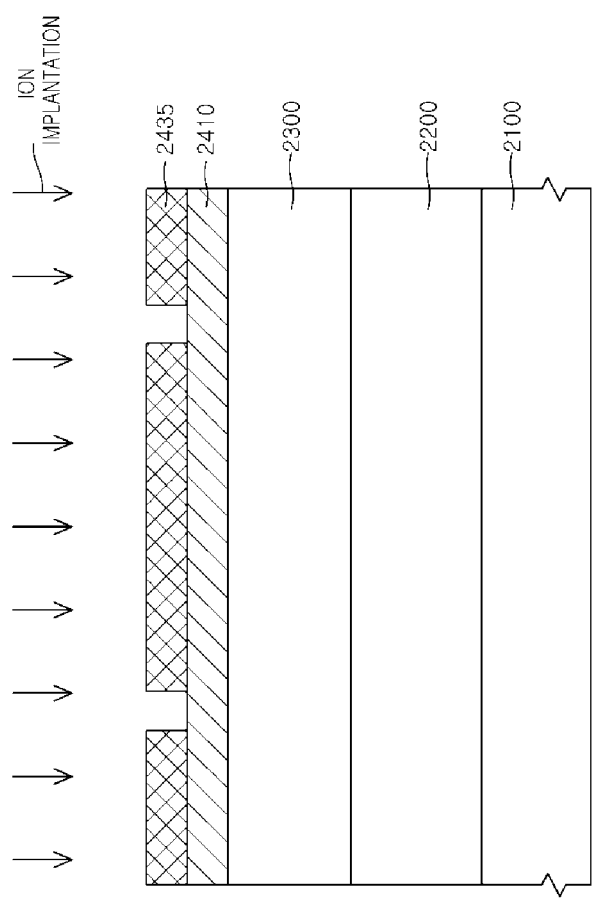

FIG. 18 illustrates a step of forming neutral patterns 2435. Specifically, a surface treatment process may be applied to the hard mask patterns 2431. The surface treatment process may be performed to reinforce a hydrophobic property of surfaces of the hard mask patterns 2431 by introducing charged particles, for example, impurity ions into the hard mask patterns 2431. That is, if the charged particles are implanted into the hard mask patterns 2431, the hard mask patterns 2431 may be changed to have a hydrophobic property even though the hard mask layer 2430 initially has a hydrophilic property. That is, the hard mask patterns 2431 may be changed into the neutral patterns 2435 having hydrophobic surfaces by the surface treatment process.

Figure 19:
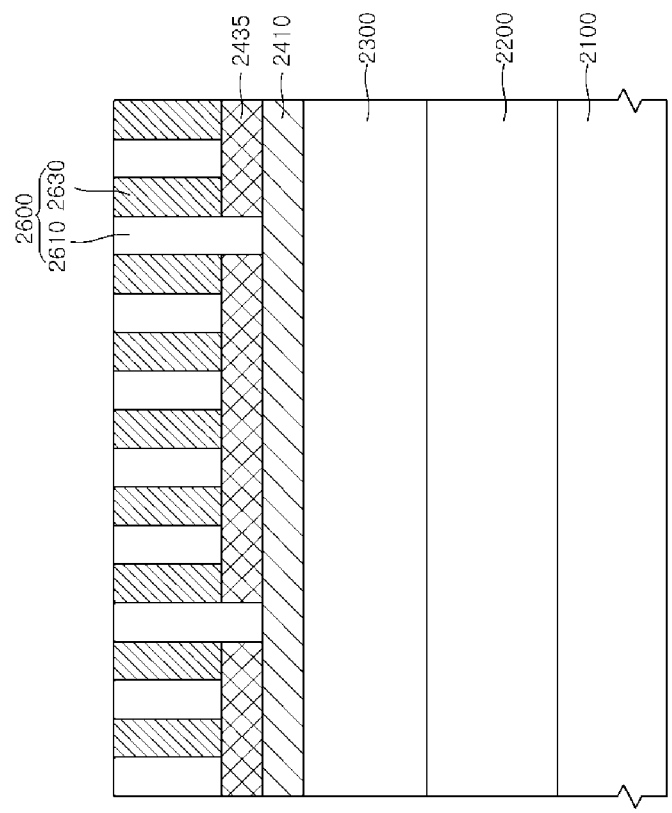

FIG. 19 illustrates a step of forming a phase-separated block co-polymer (BCP) layer 2600 covering the neutral patterns 2435. Specifically, after forming a BCP layer 2600 on the neutral patterns 2435 and the lower layer 2410, the BCP layer 2600 may be annealed to phase-separate the BCP layer 2600 into first domains 2610 and second domains 2630. The BCP layer 2600 may be formed by coating a polystyrene-poly (methyl meta acrylate) (PS-PMMA) co-polymer material. Polystyrene (PS) blocks in the BCP layer 2600 may be phase-separated to form the first domains 2610, and poly(methyl meta acrylate) (PMMA) blocks in the BCP layer 2600 may be phase-separated to form the second domains 2630.

Polymer blocks of the BCP layer 2600 may be vertically aligned on the neutral patterns 2435. The first domains 2610 including the PS polymers in the BCP layer 2600 may be primarily aligned on portions of the lower layer 2410 which are exposed by the neutral patterns 2435. Meanwhile, since the neutral patterns 2435 have hydrophobic surfaces, the BCP layer 2600 may be phase-separated such that the polymer blocks of the BCP layer 2600 are vertically aligned on the neutral patterns 2435. As described above, the neutral patterns 2435 may be formed such that a width of the neutral patterns 2435 may be "N+1" (wherein, "N" denotes a positive integer) times greater than a space between the neutral patterns 2435. Since the first domains 2610 of the BCP layer 2600 are primarily arrayed and aligned between the neutral patterns 2435, the second domains 2630 and the first domains 2610 of the BCP layer 2600 may be alternately and repeatedly aligned on each of the neutral patterns 2435 in a lateral direction.

Figure 20:
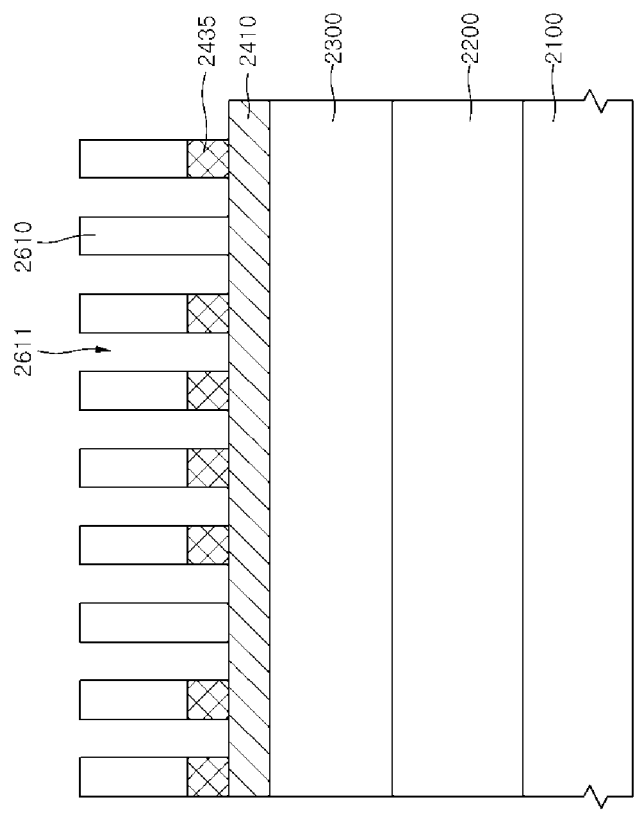

FIG. 20 illustrates a step of selectively removing the second domains 2630. Specifically, the second domains 2630 may be selectively removed to form opening portions 2611 between the first domains 2610. That is, PMMA blocks constituting the second domains 2630 may be selectively etched and removed. Since the solubility of the PMMA blocks constituting the second domains 2630 is different from that of the PS blocks constituting the first domains 2610, the PMMA blocks constituting the second domains 2630 may be selectively removed using a wet etching process that employs a solution including an etchant. If each of the second domains 2630 is formed to have a line shape, each of the opening portions 2611 may also be formed to have an elongated line shape.

Although not shown in the drawings, after selectively removing the second domains 2630, the exposed portions of the neutral patterns 2435 may be etched using the first domains 2610 as etch masks to form hard mask patterns remaining under the first domains 2610. Subsequently, the lower layer 2410 may be etched using the first domains 2610 as etch masks to form lower layer patterns. In addition, the main hard mask layer 2300 and the etch target layer 2200 may be patterned to form etch target patterns.

According to the embodiments described above, nano-sized structures or nano structures may be readily fabricated by forming a block co-polymer (BCP) layer on a large-sized substrate. The nano structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, electronic/electric components for patterning nano-scaled interconnections, catalysts of solar cells and fuel cells, etch masks, organic light emitting diodes (OLEDs), and gas sensors.

The methods according to the aforementioned embodiments and structures formed thereby may be used in fabrication of integrated circuit (IC) chips. The IC chips may be supplied to users in a raw wafer form, in a bare die form, or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments have been disclosed above for illustrative purposes. Those skilled in the art will appreciate that various modifications, additions and substitutions are possible.

What is claimed is:

1. A method of forming patterns, the method comprising:
performing a surface treatment process on a hard mask layer to form a neutral layer with a hydrophobic property;
forming a block co-polymer layer over the neutral layer; and
phase-separating the block co-polymer layer into first domains and second domains.

2. The method of claim 1, wherein the surface treatment process is performed using a process of implanting impurity ions onto the hard mask layer.

3. The method of claim 2, wherein the implantation process is performed using a gas including a carbon fluoride gas as a source gas.

4. The method of claim 2, wherein the surface treatment process changes a surface energy of the hard mask layer by using at least one of a source gas, a dose of the impurity ions, a radio frequency (RF) power, a bias power, and a process pressure of the ion implantation process.

5. The method of claim 2, wherein the hard mask layer includes an inorganic material layer having a hydrophilic property.

6. The method of claim 5, wherein the hard mask layer includes an inorganic material layer containing silicon.

7. The method of claim 6, wherein the inorganic material layer includes at least one of a silicon oxide layer and a silicon oxynitride layer.

8. The method of claim 6, further comprising:
forming a main hard mask layer under the hard mask layer, wherein the main hard mask layer includes a spin-on-carbon layer or an amorphous carbon layer.

9. The method of claim 1, further comprising:
selectively removing the second domains; and
etching the hard mask layer using the first domains as etch masks to form hard mask patterns.

10. The method of claim 1,
wherein the first domains and the second domains are alternately arrayed; and
wherein each of the first domains and the second domains has an elongated line shape.

11. A method of forming patterns, the method comprising:
forming guide patterns over a hard mask layer;
applying a surface treatment process on portions of the hard mask layer exposed by the guide patterns to form neutral portions with a hydrophobic property;
forming a block co-polymer layer over the hard mask layer including the neutral portions; and
phase-separating the block co-polymer layer into first domains and second domains.

12. The method of claim 11, wherein each of the guide patterns includes a photoresist layer or a stack of a bottom anti-reflective coating (BARC) layer and a photoresist layer.

13. The method of claim 11, wherein a space between the guide patterns is "N+1" times greater than a width of each of the guide patterns, wherein, "N" denotes a positive integer.

14. The method of claim 13,
wherein the first domains are aligned over the hard mask layer, untreated by the surface treatment process portions, and disposed between the neutral portions; and
wherein the first domains and the second domains are alternately arrayed over each of the neutral portions.

15. The method of claim 11, wherein forming the guide patterns comprises:
forming a polymer matrix layer including a material which forms one of the first domain and the second domain;
forming photoresist patterns over the polymer matrix layer; and
selectively removing portions of the polymer matrix layer exposed by the photoresist patterns to form polymer matrix patterns.

16. The method of claim 15,
wherein the first domains are aligned over the polymer matrix patterns;

wherein the first domains and the second domains are alternately arrayed over the neutral portions.

17. The method of claim 11, further comprising:
selectively removing the second domains; and
etching the hard mask layer using the first domains as etch masks to form hard mask patterns.

18. The method of claim 11,
wherein the first domains and the second domains are alternately arrayed over the neutral portions; and
wherein each of the first domains and the second domains has an elongated line shape.

19. A method of forming patterns, the method comprising:
forming mask patterns over a hard mask layer;
selectively removing portions of the hard mask layer exposed by the mask patterns to form hard mask patterns;
applying a surface treatment process to the hard mask patterns to form neutral patterns with a hydrophobic property;
forming a block co-polymer layer over the neutral patterns; and
phase-separating the block co-polymer layer into first domains and second domains.

20. The method of claim 19, wherein a width of each of the hard mask patterns is "N+1" times greater than a space between the hard mask patterns, wherein, "N" denotes a positive integer.

* * * * *